(12) United States Patent
Milota

(10) Patent No.: US 9,677,906 B2
(45) Date of Patent: Jun. 13, 2017

(54) METHOD AND DEVICE FOR CALIBRATING A MAGNETOMETER USING PARTIAL SAMPLING

(71) Applicant: MCube Inc., San Jose, CA (US)

(72) Inventor: Andy Milota, San Ramon, CA (US)

(73) Assignee: mCube Inc., San Jose, CA (US)

( * ) Notice: Subject to any disclaimer, the term of this patent is extended or adjusted under 35 U.S.C. 154(b) by 549 days.

(21) Appl. No.: 14/242,838

(22) Filed: Apr. 1, 2014

(65) Prior Publication Data

US 2014/0303925 A1  Oct. 9, 2014

Related U.S. Application Data

(60) Provisional application No. 61/807,994, filed on Apr. 3, 2013.

(51) Int. Cl.
*G01C 25/00* (2006.01)
*G01C 17/38* (2006.01)
*G01R 33/00* (2006.01)

(52) U.S. Cl.
CPC .............. *G01C 25/00* (2013.01); *G01C 17/38* (2013.01); *G01R 33/0035* (2013.01)

(58) Field of Classification Search
CPC ..................................................... G01C 25/00
See application file for complete search history.

(56) References Cited

U.S. PATENT DOCUMENTS

2013/0124129 A1* 5/2013 Waters ................ G01C 17/38
702/92

* cited by examiner

*Primary Examiner* — Manuel Rivera Vargas
(74) *Attorney, Agent, or Firm* — Kilpatrick Townsend & Stockton LLP

(57) ABSTRACT

A method and device for calibrating a magnetometer device. In an embodiment, the present invention provides a method to automatically calibrate a magnetometer device in the background with only limited movement in each of the three axis (approximately 20 degrees in each direction). A device implementing the present method will never get stuck in a lock-up state. Embodiments of the present invention provide a conservative and accurate magnetometer status indicator that is essential for indoor navigation using inertial sensors. The implemented algorithm is relatively low computationally intensive and is intelligent enough to know when it has the right kind and right amount of magnetic data before it initiates a calibration.

20 Claims, 4 Drawing Sheets

METHOD AND DEVICE FOR CALIBRATING A MAGNETOMETER USING PARTIAL SAMPLING

CROSS-REFERENCES TO RELATED APPLICATIONS

The present application claims priority to and incorporates by reference, for all purposes, the following provisional patent application: U.S. Provisional App. 61/807,994, filed Apr. 3, 2013.

BACKGROUND OF THE INVENTION

The present invention is directed to navigational devices and methods for navigation. More specifically, embodiments of the invention provide a method and system for operating a magnetometer device for navigation and the like.

The use of navigational tools within portable handheld devices has been widespread in contemporary society. The ability to quickly and accurately determine a user's location and heading toward a desired destination is highly desirable. Contemporary mobile and hand-held devices often implement electronic compass devices or magnetometer devices to assist in indoor navigation and inertial-aided outdoor navigation. However, these contemporary devices suffer from several undesirable characteristics such as poor compensation, poor accuracy, lock-up states, and resource inefficiency. As these applications advance, higher accuracy low-cost electronic compass devices are required.

From the above, it is seen that techniques for improving operation of magnetometer devices and methods are highly desired.

BRIEF SUMMARY OF THE INVENTION

The present invention is directed to navigational devices and methods for navigation. More specifically, embodiments of the invention provide a method and system for operating a magnetometer device for navigation and the like. These navigational systems can include physical sensors such as MEMS devices and the like. Merely by way of example, the MEMS device can include at least an accelerometer, a gyroscope, a magnetometer, a pressure sensor, a microphone, a humidity sensor, a temperature sensor, a chemical sensor, a biosensor, an inertial sensor, and others. But it will be recognized that the invention has a much broader range of applicability.

The accuracy of electronic compass devices or magnetometer devices depend upon at least five factors:
  Compass tilt-errors
  Location on earth and availability of World Magnetic Models
  Temperature effects on the magnetometer and accelerometer
  Hard Iron effects
  Soft Iron effects Embodiments of the present invention address issues with the Hard and Soft Iron effects. Without compensating for these effects, any electronic compass device would be rendered useless. In an embodiment, a magnetic auto-calibration method and device include the following features:
  Calibrates automatically in the background with only limited movement in each of the three axis (approximately 20 degrees in each direction).
  Will never get stuck in a lock-up state as described in section B above.
  Provides a conservative and accurate magnetometer status indicator that is essential for indoor navigation using inertial sensors.
  Relatively low computational intensity as the algorithm is intelligent enough to know when it has the right kind and right amount of magnetic data before it initiates a calibration.

Various additional objects, features and advantages of the present invention can be more fully appreciated with reference to the detailed description and accompanying drawings that follow.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE INVENTION

The present invention is directed to navigational devices and methods for navigation. More specifically, embodiments of the invention provide a method and system for operating a magnetometer device for navigation and the like. These navigational systems can include physical sensors such as MEMS devices and the like. Merely by way of example, the MEMS device can include at least an accelerometer, a gyroscope, a magnetometer, a pressure sensor, a microphone, a humidity sensor, a temperature sensor, a chemical sensor, a biosensor, an inertial sensor, and others. But it will be recognized that the invention has a much broader range of applicability.

The accuracy of electronic compass devices or magnetometer devices depend upon at least five factors:
  Compass tilt-errors
  Location on earth and availability of World Magnetic Models
  Temperature effects on the magnetometer and accelerometer
  Hard Iron effects
  Soft Iron effects Commercially available electronic compasses or magnetometer devices algorithms use algorithms that having the following undesirable characteristics:
  1. They simply due a poor job of compensating for the Soft Iron effects. Net result is large heading errors on the eCompass.

2. They require the user to request a calibration of the magnetometer and then for the user to move the phone in a figure eight motion in two or more planes.
3. When a large magnetic anomaly is introduced near the phone, if the algorithm is able to calibrate this effect out, once the anomaly is removed, the magnetometer will not recalibrate until the phone is power-cycled. This is known as a lockup state.
4. The magnetometer drivers SW associated with the existing calibration algorithms provide magnetometer status indicators that are inaccurate.
5. Algorithms that do attempt to automatically calibrate in the background do so unintelligibly thereby wasting processor throughput and power by performing unnecessary and unfruitful calculations.

Embodiments of the present invention address issues with the Hard and Soft Iron effects. Without compensating for these effects, any electronic compass device would be rendered useless. In an embodiment, a magnetic auto-calibration method and device include the following features:

Calibrates automatically in the background with only limited movement in each of the three axis (approximately 20 degrees in each direction).
Will never get stuck in a lock-up state as described above.
Provides a conservative and accurate magnetometer status indicator that is essential for indoor navigation using inertial sensors.
Relatively low computational intensity as the algorithm is intelligent enough to know when it has the right kind and right amount of magnetic data before it initiates a calibration.

Further details regarding the embodiments of the present invention and its implementation are described in the accompanying examples and figures.

Figure 1:
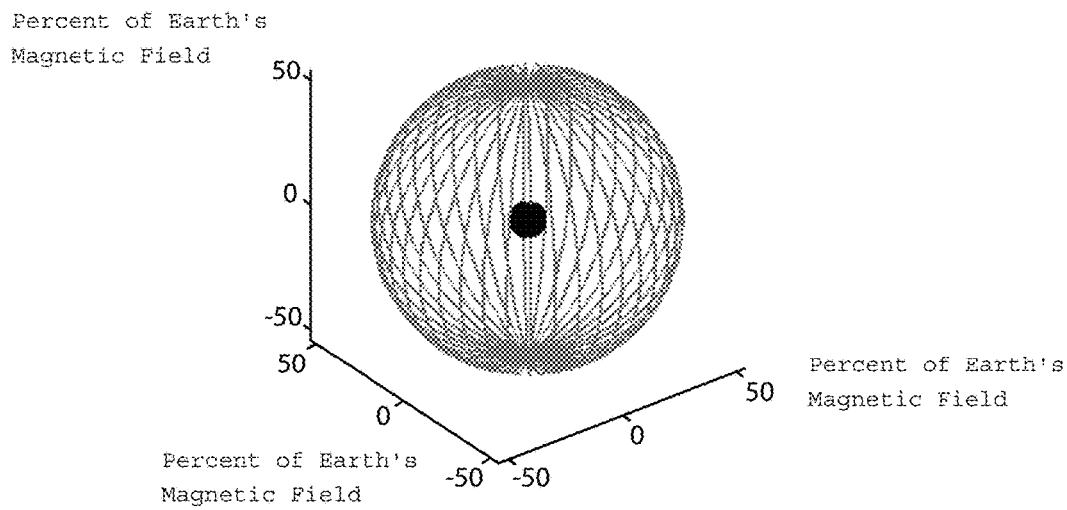
FIG. 1 is a simplified diagram illustrating an ideal spherical magnetic field.

FIG. 1 is a simplified diagram illustrating an ideal spherical magnetic field. As shown, an ideal magnetic field appears as a perfect sphere (in 3-D) centered at the origin. This illustrates a magnetic field with a field strength equal to the earth's magnetic field.

Figure 2:
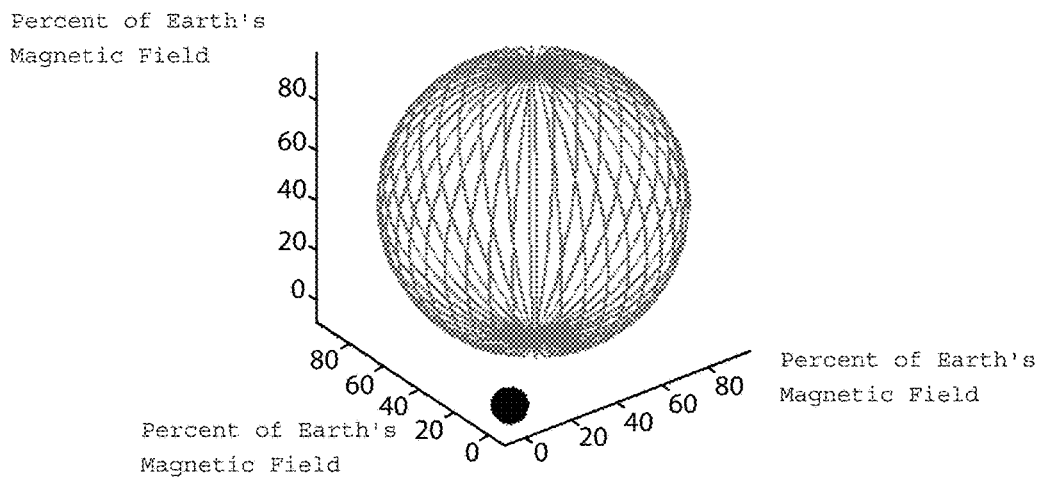
FIG. 2 is a simplified diagram illustrating a magnetic field distorted by a Hard Iron effect.

FIG. 2 is a simplified diagram illustrating a magnetic field distorted by a Hard Iron effect. Compared to FIG. 1, a magnetic field distorted by a Hard Iron effect appears as a perfect sphere (in 3-D) offset from the origin. Here, the field strength is also equal to the earth's magnetic field.

Figure 3:
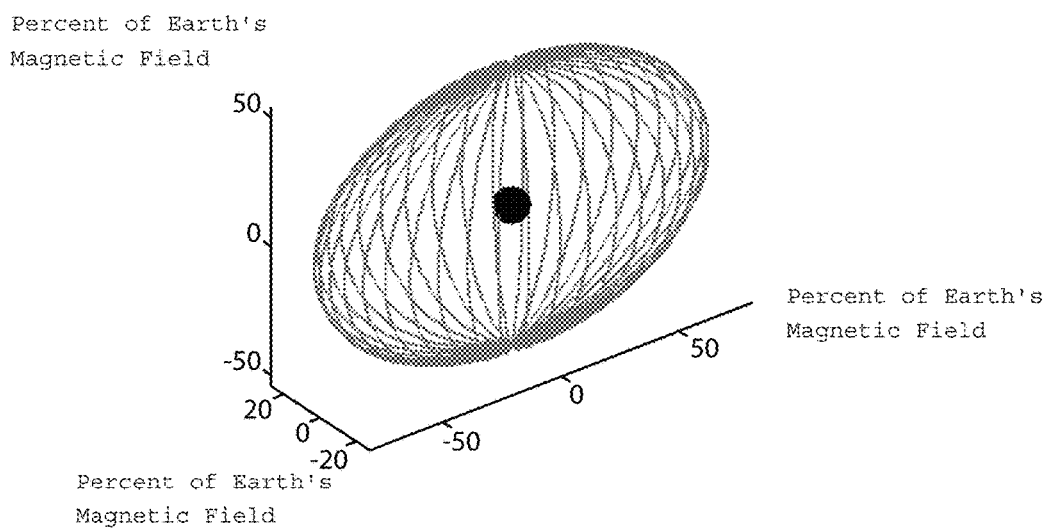
FIG. 3 is a simplified diagram illustrating a magnetic field distorted by a Soft Iron effect.

FIG. 3 is a simplified diagram illustrating a magnetic field distorted by a Soft Iron effect. Compared to FIG. 1, a magnetic field distorted by a Soft Iron effect appears as an elongated ellipse (in 3-D) centered at the origin. Here, the field strength differs from the earth's magnetic field.

Figure 4:
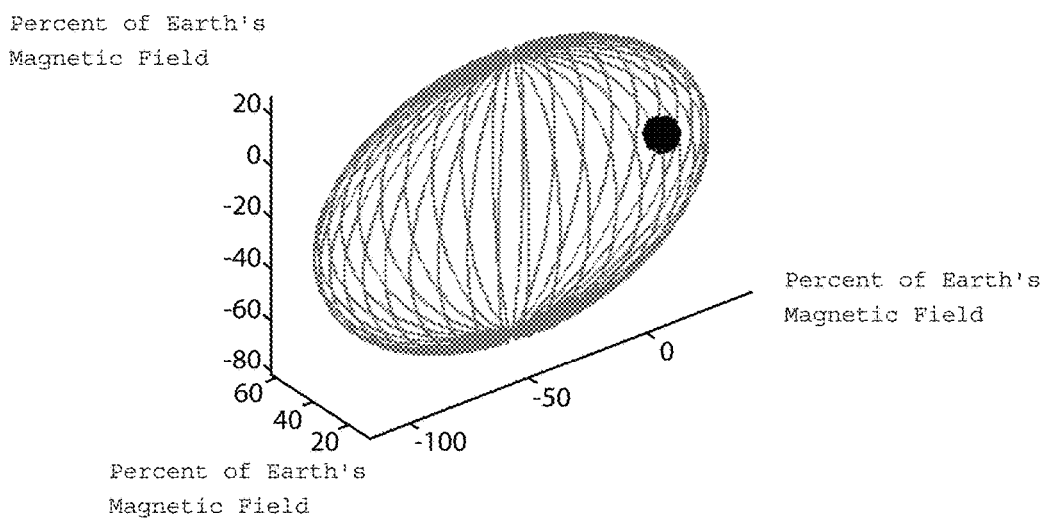
FIG. 4 is a simplified diagram illustrating a magnetic field distorted by both Hard and Soft Iron effects.

FIG. 4 is a simplified diagram illustrating a magnetic field distorted by both Hard and Soft Iron effects. Real world magnetic fields contain both Hard and Soft Iron effects. This type of field appears as an elongated ellipse offset from the origin with a field that differs from the earth's magnetic field. Thus, there is a need to calibrate a magnetometer device to compensate for these Hard and Soft Iron effects.

Figure 5:
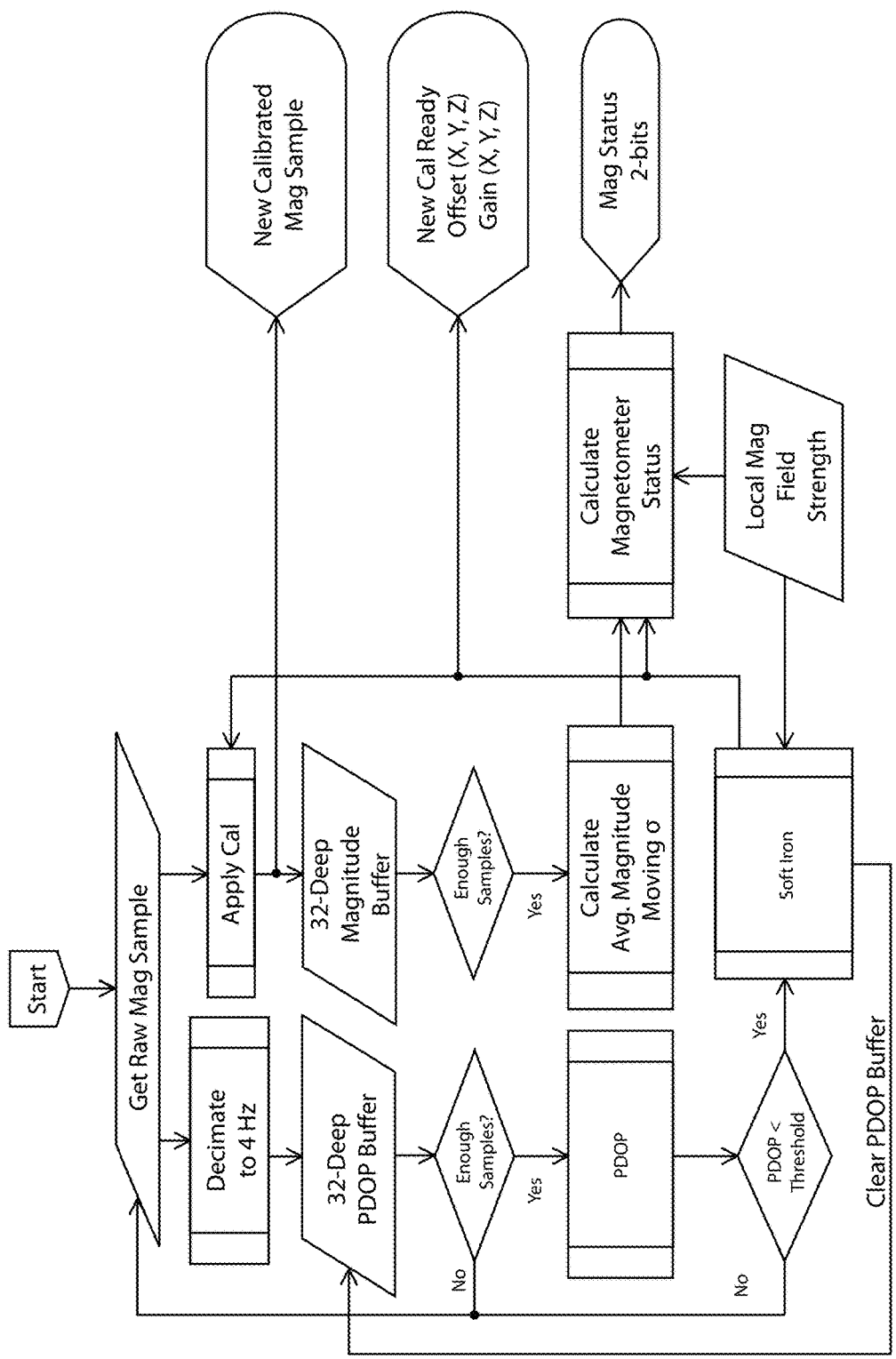
FIG. 5 is a simplified flow diagram illustrating a method of calibration according to an embodiment of the present invention.

Embodiments of the present invention provide more accurate estimates of the real world magnetic field effects and corrects for them with the following differentiators:

Works with the noise specifications of today's low-cost magnetometers
Requires only a partial sampling of the magnetic field ellipse
Can simultaneously be scaled to the earth's local magnetic field strength
Runs reliably and automatically in the background
Requires only reasonable processing requirements FIG. 5 is a simplified flow diagram illustrating a method of calibration according to an embodiment of the present invention. The flow diagram includes the following major blocks:

1. Decimator—Decimates the raw magnetometer data to a 4 Hz rate no matter the input sample rate.
2. PDOP (Positional and Time Dilution of Precision) Buffer –32-deep buffer of raw magnetometer data to be used by the PDOP and Soft-Iron functions.
3. PDOP Function—Operates on data in the PDOP buffer only. Calculates the geometric mean, translates all samples to be centered around the mean, calculates PDOP along with the average magnitude of the translated samples.
4. Soft Iron Function—Uses the local (or default) magnetic field strength along with PDOP buffer data as inputs once the appropriate PDOP characteristics have been met. Outputs X, Y, and Z offsets and gains.
5. Apply Calibration—Applies offset and gain values from the SI Function to the raw magnetometer data (B) to form B'.
6. Magnitude Buffer—32-deep buffer of calibrated magnetometer data for use by the Magnitude Function.
7. Magnitude Function—Operates on data in the Magnitude Buffer. Calculates the moving average (u) of the magnitude along with the moving sigma of the magnitude.
8. Magnitude Status Block—Provides a two-bit magnetometer status by using the local magnetic field along with the u and sigma outputs from the Magnitude Function.

The PDOP and SI Functions are the only blocks that contain any amount of computational rigor, and both are relatively simple or get exercised only occasionally. Here are the details:

The PDOP executes at a 4 Hz rate and requires the inversion of a 3×3 matrix each iteration.
The SI Function calculates the HI and SI coefficients, runs sparingly (only when a good PDOP value is available), inverts a 6×6 matrix. Max theoretical rate for the SI Function to execute is 0.125 Hz, or once every 8 seconds.
MATLAB results with simulated data (shown in FIG. 6):
Partial ellipse with noise
Even with a small portion of the ellipse, algorithm still correctly estimates HI and SI coefficients In an embodiment, the present invention provides a computer implemented method for calibrating a magnetometer device. More particularly, the present method can be effectively applied to low-cost magnetometers characterized by high noise margins. The method can include receiving a raw magnetometer data sample and applying a decimating process to form a decimated data sample. In a specific embodiment, the decimating process can include decimating the raw magnetometer data sample to a 4 Hz rate.

A PDOP buffer can be applied to the decimated data sample to form a PDOP buffer data sample. In a specific embodiment the PDOP buffer can include a 32-bit buffer configured for the PDOP and Soft Iron functions. A PDOP function can be applied to the PDOP buffer data sample. The PDOP function can include calculating a geometric mean of the decimated data sample, translating the decimated data sample to be centered around the geometric mean, and calculating a PDOP value and an average magnitude of the decimated data sample.

The method can include applying a Soft Iron function to the buffer data sample. In a specific embodiment, the Soft Iron function can include calculating X, Y, and Z offsets and gains using the PDOP buffer data sample and a reference magnetic field strength. This magnetic field strength can be from a local magnetic field, a default magnetic field, or the like. A calibration can be applied from the Soft Iron function to the raw magnetometer data to form a calibrated data sample. This calibration can include applied the offsets and gains from the Soft Iron function.

The method can include applying a magnitude buffer to the calibrated data sample to form a magnitude buffer data sample. In a specific embodiment, the magnitude buffer includes a 32-bit buffer configured for the magnitude function. A magnitude function can be applied to the magnitude buffer data sample. This magnitude function can include calculating a moving average value and a moving sigma value of the magnitude. A magnitude status can be provided using the magnitude buffer data sample. The magnitude status can be a two-bit magnetometer status using a local magnetic field, the moving average value, and the moving sigma value.

Figure 6:
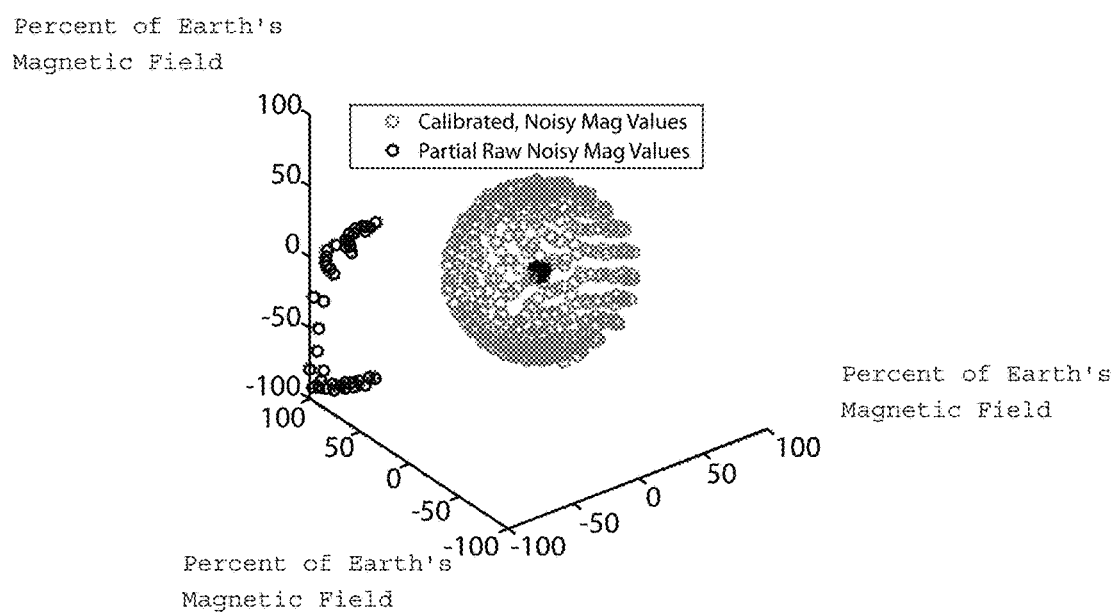
FIG. 6 is a simplified diagram illustrating detected magnetic field data according to an embodiment of the present invention.

FIG. 6 is a simplified diagram illustrating detected magnetic field data according to an embodiment of the present invention. Partial raw noisy magnetic field values and calibrated noisy magnetic field data values are shown.

Quality of results depends on:
 GDOP (Geometric Dispersion of Position)
 Sigma (mag noise)
  SNR>43 dB to guarantee good results
  Q=GDOP*Sigma It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A computer implemented method for calibrating a magnetometer device, the method comprising:
  measuring a raw magnetometer data sample using the magnetometer, while the magnetometer device is moved in each of the three axis by approximately 20 degrees in each direction;
  receiving the raw magnetometer data sample;
  applying a decimating process to the raw magnetometer data sample to form a decimated data sample;
  applying a PDOP (Positional Dilution of Precision) buffer to the decimated data sample to form a PDOP buffer data sample;
  applying a PDOP function to the PDOP buffer data sample;
  applying a Soft Iron function to the PDOP buffer data sample;
  making a new measurement of a new raw magnetometer data sample;
  applying a calibration from the Soft Iron function to the new raw magnetometer data sample to form a calibrated data sample;
  applying a magnitude buffer to the calibrated data sample to form a magnitude buffer data sample;
  applying a magnitude function to the magnitude buffer data sample; and
  providing a magnetometer status using the magnitude buffer data sample.

2. The method of claim 1 wherein the Soft Iron function comprises calculating X, Y, and Z offsets and gains using the PDOP buffer data sample and a local magnetic field strength.

3. The method of claim 2 wherein the calibration comprises applying the X, Y, and Z offsets and gains to the raw magnetometer data sample.

4. The method of claim 1 wherein the magnitude function comprises calculating a moving average value and a moving sigma value.

5. The method of claim 4 wherein the providing magnitude status comprises providing a two-bit magnetometer status using a local magnetic field, the moving average value, and the moving sigma value.

6. The method of claim 1 wherein the decimating process comprises decimating the raw magnetometer data sample to a 4 Hz rate.

7. The method of claim 1 wherein the PDOP buffer comprises a 32-bit buffer configured for the PDOP and Soft Iron functions.

8. The method of claim 1 wherein the PDOP function comprises calculating a geometric mean of the decimated data sample, translating the decimated data sample to be centered around the geometric mean, and calculating a PDOP value and an average magnitude of the decimated data sample.

9. The method of claim 1 wherein the magnitude buffer comprises a 32-bit buffer configured for the magnitude function.

10. The method of claim 1 wherein the magnetometer is characterized by high noise margins.

11. A computer implemented method for calibrating a magnetometer device, the method comprising:
  measuring a raw magnetometer data sample using the magnetometer, while the magnetometer device is moved in each of the three axis by approximately 20 degrees in each direction;
  receiving the raw magnetometer data sample;
  decimating the raw magnetometer data sample to form a decimated data sample;
  applying a PDOP (Positional Dilution of Precision) function to the decimated data sample to form a PDOP data sample;
  applying a Soft Iron function to the PDOP data sample;
  making a new measurement of a new raw magnetometer data sample;
  calibrating the new raw magnetometer data sample using the result from the Soft Iron function to form a calibrated data sample;
  applying a magnitude function to the calibrated data sample; and
  providing a magnetometer status using the result of the magnitude function.

12. The method of claim 11 wherein the Soft Iron function comprises calculating X, Y, and Z offsets and gains using the PDOP buffer data sample and a local magnetic field strength.

13. The method of claim 12 wherein the calibration comprises applying the X, Y, and Z offsets and gains to the raw magnetometer data sample.

14. The method of claim 11 wherein the magnitude function comprises calculating a moving average value and a moving sigma value using the calibrated data sample in a 32-bit magnitude buffer.

15. The method of claim 14 wherein the providing magnitude status comprises providing a two-bit magnetometer status using a local magnetic field, the moving average value, and the moving sigma value.

16. The method of claim 11 wherein the decimated data sample is characterized by a 4 Hz rate.

17. The method of claim 11 wherein the PDOP function comprises calculating a geometric mean of the decimated data sample, translating the decimated data sample to be centered around the geometric mean, and calculating a PDOP value and an average magnitude of the decimated data sample in a 32-bit PDOP buffer.

18. A computer implemented method for calibrating a magnetometer device, the method comprising:

measuring a raw magnetometer data sample using the magnetometer, while the magnetometer device is moved in each of the three axis by approximately 20 degrees in each direction;

receiving the raw magnetometer data sample;

applying a decimating process to the raw magnetometer data sample to form a decimated data sample;

applying a 32-bit PDOP (Positional Dilution of Precision) buffer to the decimated data sample to form a PDOP buffer data sample;

applying a PDOP function to the PDOP buffer data sample, wherein the PDOP function comprises calculating a geometric mean of the decimated data sample, translating the decimated data sample to be centered around the geometric mean, and calculating a PDOP value and an average magnitude of the decimated data sample;

applying a Soft Iron function to the PDOP buffer data sample, wherein the Soft Iron function comprises calculating X, Y, and Z offsets and gains using the PDOP buffer data sample and a local magnetic field strength;

making a new measurement of a new raw magnetometer data sample;

applying a calibration from the Soft Iron function to the new raw magnetometer data sample to form a calibrated data sample, wherein the calibration comprises applying the X, Y, and Z offsets and gains to the raw magnetometer data sample;

applying a 32-bit magnitude buffer to the calibrated data sample to form a magnitude buffer data sample;

applying a magnitude function to the magnitude buffer data sample, wherein the magnitude function comprises calculating a moving average value and a moving sigma value; and providing a magnetometer status using the magnitude buffer data sample, wherein the magnitude status comprises a two-bit magnetometer status determined using a local magnetic field, the moving average value, and the moving sigma value.

19. The method of claim 18 wherein the PDOP function is executed at a 4 Hz rate and is characterized by the inversion of a 3×3 matrix.

20. The method of claim 18 wherein the Soft Iron function is executed at a maximum rate of 0.125 Hz and is characterized by the inversion of a 6×6 matrix.

* * * * *